(12) United States Patent
Rofougaran

(10) Patent No.: US 9,000,969 B2
(45) Date of Patent: *Apr. 7, 2015

(54) VARIABLE RESOLUTION DATA CONVERSION IN A RECEIVER

(71) Applicant: Broadcom Corporation, Irvine, CA (US)

(72) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 225 days.

This patent is subject to a terminal disclaimer.

(21) Appl. No.: 13/660,800

(22) Filed: Oct. 25, 2012

(65) Prior Publication Data

US 2013/0069810 A1    Mar. 21, 2013

Related U.S. Application Data

(63) Continuation of application No. 13/108,686, filed on May 16, 2011, now Pat. No. 8,299,949, which is a continuation of application No. 11/954,962, filed on Dec. 12, 2007, now Pat. No. 7,965,215.

(51) Int. Cl.
*H03M 1/12* (2006.01)
*H03M 1/18* (2006.01)
*H03M 1/00* (2006.01)

(52) U.S. Cl.
CPC .............. *H03M 1/186* (2013.01); *H03M 1/007* (2013.01)

(58) Field of Classification Search
CPC ........ H03M 1/12; H03M 1/007; H03M 1/186
USPC .......... 341/125–166; 375/285, 296, 344, 345, 375/350, 334; 455/126, 307, 213, 226.2, 455/226.1; 327/337, 554
See application file for complete search history.

(56) References Cited

U.S. PATENT DOCUMENTS

| | | | |
|---|---|---|---|
| 6,259,313 B1 * | 7/2001 | Lewicki .......................... 327/563 |
| 6,351,506 B1 * | 2/2002 | Lewicki .......................... 375/350 |
| 6,993,291 B2 * | 1/2006 | Parssinen et al. ........... 455/67.11 |
| 7,043,206 B2 * | 5/2006 | Herdey et al. ................. 455/63.1 |
| 7,136,430 B2 * | 11/2006 | Morris et al. .................. 375/316 |
| 7,171,176 B1 * | 1/2007 | Birleson ...................... 455/173.1 |
| 7,424,274 B2 * | 9/2008 | Morris et al. .................. 455/102 |
| 7,511,465 B2 * | 3/2009 | Xiao et al. ..................... 323/283 |
| 7,522,885 B2 * | 4/2009 | Parssinen et al. ........... 455/67.11 |
| 7,965,215 B2 * | 6/2011 | Rofougaran ................... 341/155 |

(Continued)

*Primary Examiner* — Lam T Mai
(74) *Attorney, Agent, or Firm* — Oblon, McClelland, Maier & Neustadt, L.L.P.

(57) ABSTRACT

A received plurality of signals may be filtered to select an in-band signal and/or an out-of-band. A signal strength of the selected signal(s) may be measured. A resolution of an analog-to-digital converter may be controlled based on the measured signal strength(s). The selected in-band signal may be converted to a digital representation via the analog-to-digital converter. The resolution may be decreased when the strength of the in-band signal is higher, and increased when the strength of the in-band signal is lower. The resolution may be increased when the strength of the out-of-band signal is higher, and decreased when the strength of the out-of-band signal is lower. A signal-to-noise ratio and/or dynamic range of the selected signal(s) may be determined based on the measured signal strength(s), and may be utilized to adjust the resolution of the analog-to-digital converter.

21 Claims, 5 Drawing Sheets

(56) References Cited

U.S. PATENT DOCUMENTS

| | | | |
|---|---|---|---|
| 7,986,932 B1* | 7/2011 | Zhang | 455/307 |
| 8,040,976 B2* | 10/2011 | Morris et al. | 375/316 |
| 8,299,949 B2* | 10/2012 | Rofougaran | 341/155 |
| 2003/0078007 A1* | 4/2003 | Parssinen et al. | 455/67.1 |
| 2006/0079191 A1* | 4/2006 | Parssinen et al. | 455/226.1 |
| 2007/0223626 A1* | 9/2007 | Waxman | 375/316 |
| 2009/0154612 A1* | 6/2009 | Rofougaran | 375/344 |

* cited by examiner

VARIABLE RESOLUTION DATA CONVERSION IN A RECEIVER

This is a continuation of application Ser. No. 13/108,686 filed May 16, 2011.

CROSS-REFERENCE TO RELATED APPLICATIONS/INCORPORATION BY REFERENCE

This application is a continuation of U.S. patent application Ser. No. 11/954,962 which was filed on Dec. 12, 2007.

FIELD OF THE INVENTION

Certain embodiments of the invention relate to signal processing. More specifically, certain embodiments of the invention relate to a method and system for variable resolution data conversion in a receiver.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for variable resolution data conversion in a receiver, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for variable resolution data conversion in a receiver. In this regard, an analog received signal may be converted to a corresponding digital signal, wherein a resolution of the corresponding digital signal may be varied (e.g., by configuring one or more switching elements) for the conversion based on one or more determined characteristics of said received signal. In this regard, the analog signal may be filtered and/or amplified prior to determining the signal characteristics. The resolution of the conversion may be determined based on characteristics of in-band and/or out-of-band signals. The resolution may be increased when received signal strength is below a threshold and may be decreased when received signal strength is above a threshold. Similarly, the resolution may be increased when interference is above a threshold and may be decreased when interference is below a threshold. The resolution may be increased when error rates are above a threshold and decreased when error rates are below a threshold.

Figure 1A:
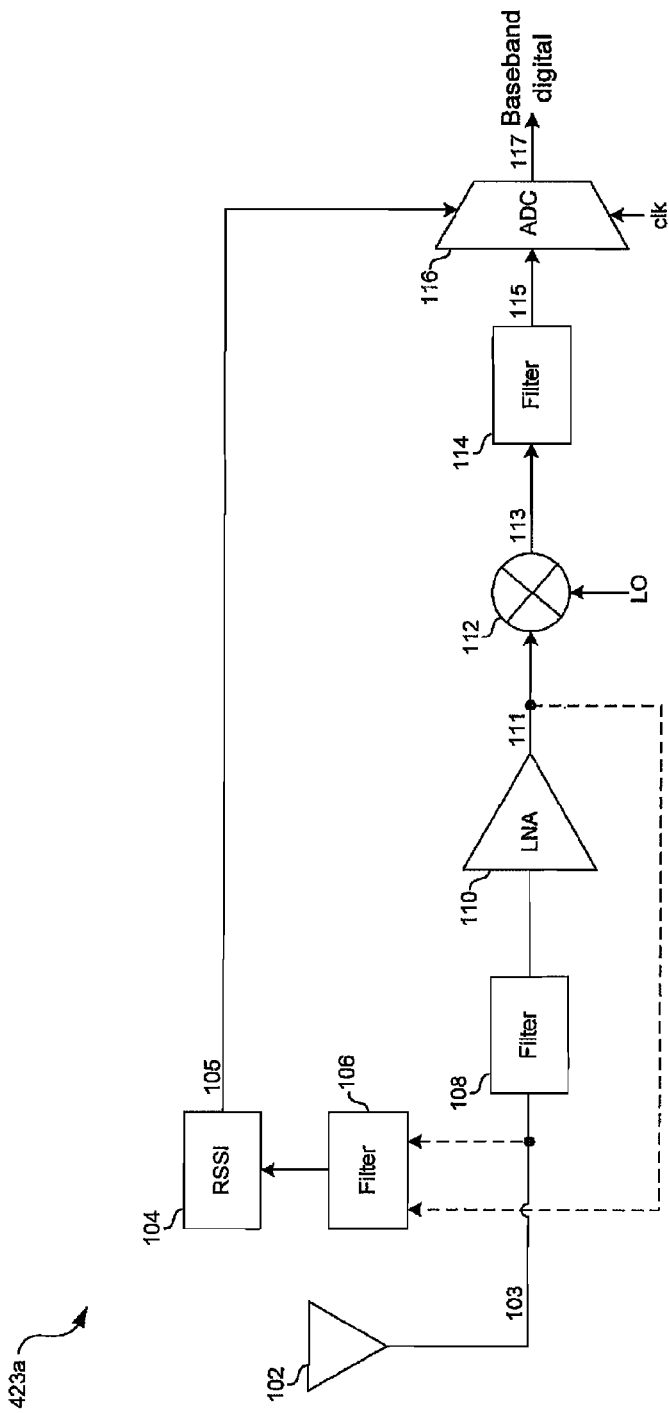
FIG. 1A is a block diagram of an exemplary receiver with a variable resolution analog to digital converter, in accordance with an embodiment of the invention.

FIG. 1A is a block diagram of an exemplary receiver with a variable resolution analog to digital converter, in accordance with an embodiment of the invention. Referring to FIG. 1A the receiver 423a may be comprise a signal strength indicator (SSI) 104, filters 106, 108, and 114, low noise amplifier (LNA) 110, mixer 112, filter 114, variable resolution analog-to-digital converter (ADC) 116, and regulator(s) 118.

The SSI 104 may comprise suitable logic, circuitry, and/or code that may enable determining signal strength. In this regard, the SSI 104 may, for example, be enabled to measure current, voltage and/or power of the signal 103 and/or 111. Additionally, the SSI 104 may be enabled to generate one or more control signals 105 which may be coupled to the ADC 116. In various embodiments of the invention, signal 105 may be a digital and/or analog signal representative of the current, voltage and/or power of the signal 103 and/or 111.

The filter 106 may comprise suitable logic, circuitry, and/ or code for attenuating undesired frequencies to a greater extent than desired frequencies. In this regard, the filter 106 may have, for example, a bandpass frequency response. The filter 108 may be tunable such that a bandwidth and/or center frequency characterizing the frequency response of the filter may be adjustable. In this manner, the filter 106 may be controlled such that the SSI 104 may perform measurements of desired frequencies, bandwidths, etc.

The filter 108 may comprise suitable logic, circuitry, and/or code for attenuating undesired frequencies to a greater extent than desired frequencies. In this regard, the filter 106 may have, for example, a bandpass frequency response. The filter 108 may be tunable such that a bandwidth and/or center frequency characterizing the frequency response of the filter may be adjustable. In this manner, the filter 108 may enable tuning the receiver 423a to a desired frequency (e.g. 60 GHz).

The filter 114 may comprise suitable logic, circuitry, and/or code for attenuating undesired frequencies to a greater extent than desired frequencies. In this regard, the filter 114 may have, for example, a bandpass frequency response. The filter 114 may be tunable such that a bandwidth and/or center frequency characterizing the frequency response of the filter may be adjustable. In this manner, the filter 114 may be enabled to reject undesired inter-modulation products output by the mixer 112 while passing desired inter-modulation products.

The mixer 112 may comprise suitable logic, circuitry, and/or code that may enable generation of inter-modulation products resulting from the mixing of a received RF signal and a local oscillator (LO). The frequency of the LO signal may be determined based on the desired frequency/channel to be received. In this regard, the mixer 112 may enable down-converting, for example, RF signals to a fixed intermediate frequency (IF) or directly to baseband. In various embodiments of the invention, resolution of the ADC 116 may be modified based on characteristics of received signals (e.g., strength of in-band and/or out-of-band frequencies). In this manner, efficiency of the system may be improved.

The LNA 110 may comprise suitable logic, circuitry, and/or code that may enable buffering and/or amplification of received RF signals. In this regard, the gain of the LNA 110 may be adjustable to enable reception of signals of varying strength. Accordingly, the output 111 of the LNA 110 may be measured (e.g., by the SSI 104) and the gain of the LNA 110 may be adjusted to maintain the signal 111 within determined limits.

The ADC 116 may comprise suitable logic, circuitry, and/or code that may enable conversion of analog signals to a digital representation. In this regard, the ADC 116 may, for example, sample and quantize analog signal 115 at times specified by a sample clock. In various embodiments of the invention, the ADC 116 may generate digital signals of variable number of bits. Moreover, the number of bits output by the ADC 116 may be configurable based on characteristics of the received signal 103 and/or the amplified signal 111. For example, when signals 103 and/or 111 are weak, the ADC may be configured or otherwise enabled for higher resolution and when the signals 103 and/or 111 are strong the ADC 116 may be configured for low resolution. In this manner, power efficiency may be increased by, for example, putting a portion of the ADC 116 into a low(er) power state when lower resolution is acceptable and those portions are unneeded. Accordingly, the ADC 116 may receive one or more control signals from, for example, a processor and/or a clock generator.

In operation, an RF signal received by the antenna 421a and/or the LNA output 111 may be measured to determine signal strength of in-band and/or out-of-band signals. In this regard, in-band may refer to signals within a passband of the filter 108 while out-of-band signals may fall in a stopband of the filter 108. The filter 106 may be adjusted and/or tuned and measurements may be taken at various frequencies and/or bandwidths in order to determine the in-band and out-of-band signal strengths. Alternatively, the SSI 104 may be enabled to determine characteristics of the received signal by, for example, performing a fast Fourier transform analysis of the signal 103 and/or 111. In this regard, determined characteristics of the signal 103 and/or 111 may be utilized to control resolution of the ADC 116. In this manner, efficiency of the receiver 423a may be improved. For example, when high resolution out of the ADC 116 is not needed, portions of the ADC 116 may be configured or enabled to operate in a low(er) power mode.

Figure 1B:
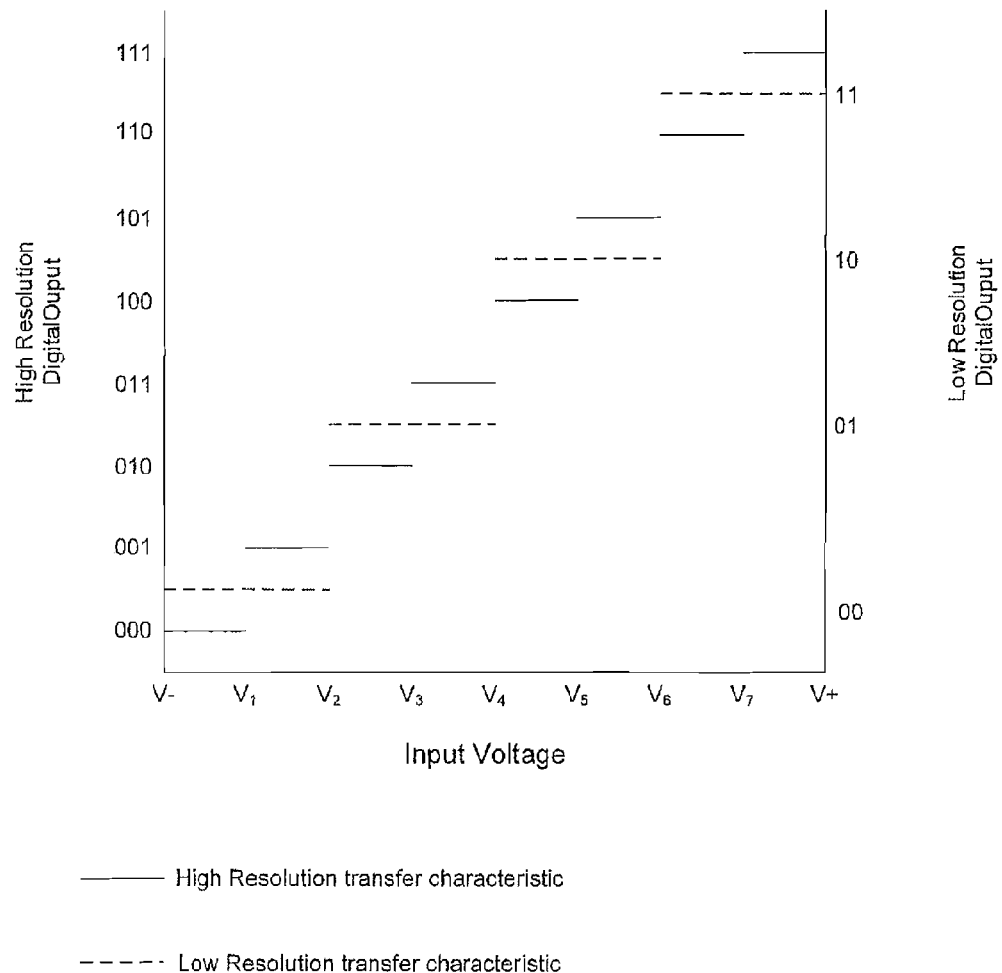
FIG. 1B is a diagram illustrating ideal behavior of an analog digital converter with variable resolution, in accordance with an embodiment of the invention.

FIG. 1B is a diagram illustrating ideal behavior of an analog digital converter with variable resolution, in accordance with an embodiment of the invention. Referring to FIG. 1B there is shown a higher resolution transfer characteristic represented with solid lines, and a lower resolution transfer characteristics represented with dashed lines.

The higher resolution characteristic illustrates an ADC configured for 3-bits of resolution, while the lower resolution transfer characteristic illustrates the ADC configured for 2 bits of resolution. In this regard, the input analog voltage to output digital representation is shown in table 1 below.

TABLE 1

Input-Output for variable resolution ADC

| Input | High Res output | Low Res Output |
|---|---|---|
| $V- < V_{in} < V_1$ | 000 | 00 |
| $V_1 < V_{in} < V_2$ | 001 | 00 |
| $V_2 < V_{in} < V_3$ | 010 | 01 |
| $V_3 < V_{in} < V_4$ | 011 | 01 |
| $V_4 < V_{in} < V_5$ | 100 | 10 |
| $V_5 < V_{in} < V_6$ | 101 | 10 |
| $V_6 < V_{in} < V_7$ | 110 | 11 |
| $V_7 < V_{in} < V+$ | 111 | 11 |

Figure 2:
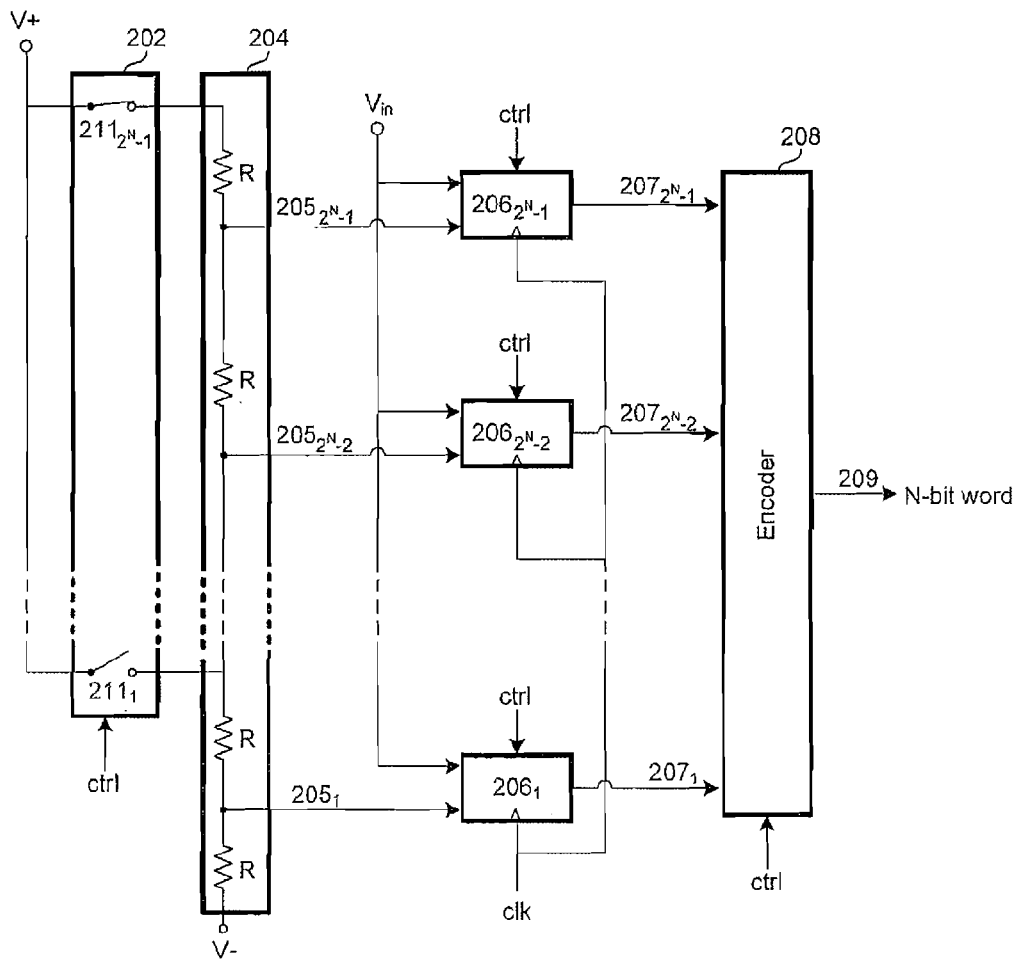
FIG. 2 is a block diagram of an exemplary variable resolution analog to digital converter, in accordance with an embodiment of the invention.

FIG. 2 is a block diagram of an exemplary variable resolution analog to digital converter, in accordance with an embodiment of the invention. Referring to FIG. 2 there is shown a switch network 202, a resistor ladder 204, a plurality of comparators 206, and an encoder 208.

The switch network 202 may comprise suitable logic, circuitry, and/or code that may enable configuring the ADC 116 based on one or more control signals. In this regard, configuration of the switch network 202 may control, at least in part, the resolution of the ADC 116. For example, switch $211_N$ may be closed and the other 'N-1' switches may be open (as depicted) resulting in 'N' bits of resolution. Alternatively, switch $211_1$ may be closed for a single bit of resolution.

The resistor ladder 204 may comprise '$2^N$' resistors for establishing reference voltages. For example, when configured for 'N' bits of resolution, the node $205_2N_{-1}$ may be the voltage $V_6$ (FIG. 1B), the node $205_2N_{-2}$ may be the voltage $V_4$ (FIG. 1B), and the node $205_1$ may be the voltage $V_2$ (FIG. 1B). In one embodiment of the invention, the resistors may each be of unit resistance such that uniformly spaced reference voltages are established. In other embodiments of the invention the resistors may be of different values such as logarithmically increasing or decreasing values, for example. In various embodiments of the invention, the resistor ladder may be replaced by another means of generating multiple reference voltages.

The comparators 206 may each comprise suitable logic, circuitry, and/or code for comparing two voltages, asserting an output when a first voltage is greater than a second voltage, and de-asserting an output when the first voltage is less than the second voltage. In an exemplary embodiment of the invention, 'N' bits of resolution may be achieved utilizing '$2^N-1$' comparators 206. In various embodiments of the invention, the comparators or portions thereof may be enabled to operate in a low(er) power state when not needed.

For example, comparators may be de-coupled from a power supply when they are not needed to achieve desired resolution. In this manner, power efficiency of the receiver 23a may be improved.

The encoder 208 may comprise suitable logic, circuitry, and/or code that may enable re-coding the output of the comparators (signal 207) to a form/encoding suitable for a block in the receiver 423a which may receive the digitized signal 209. For example, the encoder 208 may convert the thermometer coded signal 207 to a conventional 'N'-bit binary coded output 209. In thermometer encoding, each higher value is represented by a next more significant bit being asserted. For example, Table 2 below illustrates a 4-bit thermometer encoded signal and a corresponding binary coded representation.

TABLE 2

Thermometer coding to binary coding

| Thermometer coded | Binary coded |
| --- | --- |
| 0000 | 000 |
| 0001 | 001 |
| 0011 | 010 |
| 0111 | 011 |
| 1111 | 100 |

In operation, the ADC 116 may convert an analog voltage, $V_{in}$, to a binary representation, where $V_{in}$ may be greater than V− and less than V+. In this regard, $V_{in}$ may be compared against '$2^N-1$' reference voltages between V− and V+. In this regard, each reference voltage may be input to one of the comparators 206 and in instances that $V_{in}$ is greater than $V_i$, comparator $206_i$ may assert its output and in instances that $V_{in}$ is less than $V_i$, comparator $206_i$ may de-assert its output. Accordingly, the output 207 may be a '$2^N-1$'-bit "thermometer coded" signal. In some embodiments of the invention, the "thermometer" encoding may be unsuitable for use by other system components. Accordingly, the encoder 208 may convert '$2^N-1$'-bit "thermometer coded" signal to a conventional 'N'-bit binary-coded signal.

A resolution of the ADC 116 may be varied by controlling the number of resistors and comparators utilized for the conversion. For example, in the embodiment depicted, closing switch $211_{2N-1}$ and opening switch $211_1$ may result in four resistors generating three reference voltages compared to $V_{in}$ via three comparators 206, resulting in 2 bits of resolution. Alternatively, opening switch $211_{2N-1}$ and closing switch $211_1$ may result in 2 resistors generating one reference voltage compared to $V_{in}$ via one comparator 206, resulting in 1 bit of resolution. In this manner, additional resistors, comparators, and switches 211 may be added to increase available resolution of the ADC 116. For example, three additional comparators, 206, three additional resistors, and one additional switch 211 may be added to enable selecting three bit resolution.

Digitized signals may be conveyed, for example, to a digital signal processor (DSP). In this regard, the DSP may perform a variety of functions and/or operation with/on the received digital data. In this regard, one or more forms of error detection and/or correction may be performed. Accordingly, if a determined error rate is outside of a determined range, the resolution of the ADC 116 may be adjusted accordingly.

Although, the ADC 116 depicted in FIG. 2 is a "fast" or "flash" ADC, the invention is not limited in this regard. For example, variable resolution Delta-Sigma converters, Feedback converters, Algorithmic converters, etc. may be realized without deviating from the scope of the present invention.

Figure 3:
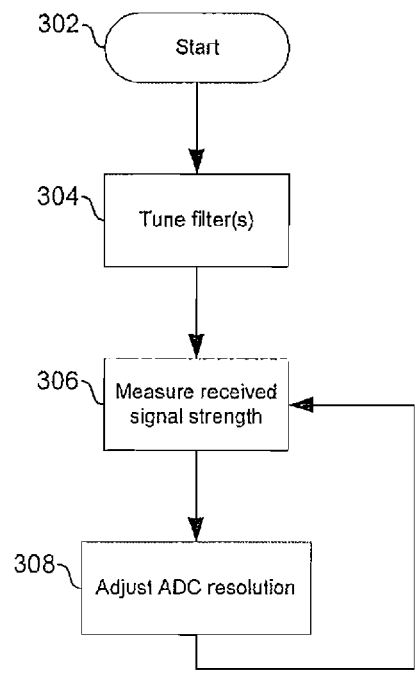
FIG. 3 is a flow chart illustrating exemplary steps for varying resolution of an analog to digital converter based on received signal characteristics, in accordance with an embodiment of the invention.

FIG. 3 is a flow chart illustrating exemplary steps for varying resolution of an analog to digital converter based on received signal characteristics, in accordance with an embodiment of the invention. Referring to FIG. 3 the exemplary steps may begin with start step 302 when signals are received by the antenna 421a. Subsequent to step 302, the exemplary steps may advance to step 304. In step 304, the filter 106, 108, and/or 114 may be tuned. In this regard, the filter 108 may be tuned to a desired channel for reception and processing by receiver 432a. In this manner, a passband of the filter 108 may be referred to herein as "in-band". Additionally, the filter 106 may be tuned to control which frequencies are measured. For example, the filter 106 may sweep one or more frequency bands to characterize the environment in which the receiver 423a may be operating. Also, the filter 114 may be tuned to select a desired inter-modulation product from the mixer 112 and reject undesired inter-modulation products generated by the mixer 112. Subsequent to step 304, the exemplary steps may advance to step 306.

In step 306, the SSI 104 may measure characteristics (e.g., signal strength, dynamic range, signal to noise ratio, etc.) of the signal 103 and/or 111. Accordingly, the signal 105 generated by the SSI 104 may be based, at least in part, on the results of the measurement of the signal 103 and/or 111. For example, the signal 105 may be a digital signal which controls the switches 211, the encoder 208, and/or portions of the comparators 206 described with respect to FIG. 2. Subsequent to step 306, the exemplary steps may advance to the step 308.

In step 308, a resolution of the ADC 116 may be adjusted via the signal 105. In this regard, reducing resolution of the ADC 116, when possible, may improve the efficiency of the receiver 423a. Subsequent to step 308, the exemplary steps may return to step 306. In this regard, the process of monitoring the signal levels and adjusting the voltage may be based on periodic or continuous feedback. Accordingly, the resolution may be dynamically adjusted to improve efficiency of the system.

Figure 4:
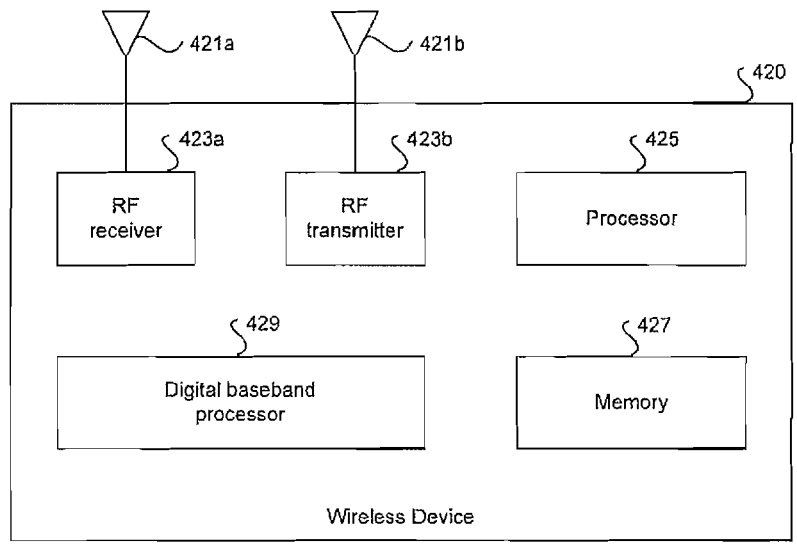
FIG. 4 is a block diagram illustrating an exemplary wireless device, in accordance with an embodiment of the invention.

FIG. 4 is a block diagram illustrating an exemplary wireless device, in accordance with an embodiment of the invention. Referring to FIG. 4, there is shown a wireless device 420 that may comprise an RF receiver 423a, an RF transmitter 423b, a digital baseband processor 429, a processor 425, and a memory 427. A receive antenna 421a may be communicatively coupled to the RF receiver 423a. A transmit antenna 421b may be communicatively coupled to the RF transmitter 423b. The wireless device 420 may be operated in a system, such as the cellular network and/or digital video broadcast network, for example.

The RF receiver 423a may comprise suitable logic, circuitry, and/or code that may enable processing of received RF signals. The RF receiver 423a may enable receiving RF signals in a plurality of frequency bands. For example, the RF receiver 423a may enable receiving signals in extremely high frequency (e.g., 60 GHz) bands. The receiver 423a may be as described with respect to FIG. 1A. In this regard, the receiver 423a may be enabled to receive, filter, amplify, down-convert, and/or perform analog to digital conversion. Moreover, resolution of the analog to digital conversion may be dynamically adjusted, and thus power efficiency of the receiver 423a may be improved over conventional receivers. In various embodiments of the invention, the wireless device 420 may comprise a plurality of the receivers 423a and may thus support multiple frequency bands and or simultaneous reception of signals in the same frequency band.

The RF receiver 423a may down convert a received RF signal. For example, the RF receiver 423a may perform direct down conversion of the received RF signal to a baseband or may convert the received RF signal to an intermediate frequency (IF). In various embodiments of the invention, the receiver 423a may perform quadrature down-conversion where in-phase components and quadrature phase components may be processed in parallel.

The digital baseband processor 429 may comprise suitable logic, circuitry, and/or code that may enable processing and/or handling of baseband signals. In this regard, the digital baseband processor 429 may process or handle signals received from the RF receiver 423a and/or signals to be transferred to the RF transmitter 423b, when the RF transmitter 423b is present, for transmission to the network. The digital baseband processor 429 may also provide control and/or feedback information to the RF receiver 423a and to the RF transmitter 423b based on information from the processed signals. In this regard, the baseband processor 429 may provide one or more control signals to the ADC 116, for controlling the switching element 202, the comparators 206, and/or the encoder 208. The digital baseband processor 429 may communicate information and/or data from the processed signals to the processor 425 and/or to the memory 427. Moreover, the digital baseband processor 429 may receive information from the processor 425 and/or to the memory 427, which may be processed and transferred to the RF transmitter 423b for transmission to the network.

The RF transmitter 423b may comprise suitable logic, circuitry, and/or code that may enable processing of RF signals for transmission. The RF transmitter 423b may enable transmission of RF signals in a plurality of frequency bands, For example, the RF transmitter 423b may enable transmitting signals in cellular frequency bands. Each frequency band supported by the RF transmitter 423b may have a corresponding front-end circuit for handling amplification and up conversion operations, for example. In this regard, the RF transmitter 423b may be referred to as a multi-band transmitter when it supports more than one frequency band. In another embodiment of the invention, the wireless device 420 may comprise more than one RF transmitter 423b, wherein each of the RF transmitter 423b may be a single-band or a multi-band transmitter.

In various embodiments of the invention, the RF transmitter 423b may perform direct up conversion of the baseband signal to an RF signal. In some instances, the RF transmitter 423b may enable digital-to-analog conversion of the baseband signal components received from the digital baseband processor 429 before up conversion. In other instances, the RF transmitter 423b may receive baseband signal components in analog form.

The processor 425 may comprise suitable logic, circuitry, and/or code that may enable control and/or data processing operations for the wireless device 420. The processor 425 may be utilized to control at least a portion of the RF receiver 423a, the RF transmitter 423b, the digital baseband processor 429, and/or the memory 427. In this regard, the processor 425 may generate at least one signal for controlling operations within the wireless device 420. In this regard, the processor 425 may provide one or more control signals to the ADC 116, for controlling the switching element 202, the comparators 206, and/or the encoder 208. The processor 425 may also enable execution of applications that may be utilized by the wireless device 420. For example, the processor 425 may execute applications that may enable displaying and/or interacting with content received via cellular transmission signals in the wireless device 420.

The memory 427 may comprise suitable logic, circuitry, and/or code that may enable storage of data and/or other information utilized by the wireless device 420. For example, the memory 427 may be utilized for storing processed data generated by the digital baseband processor 429 and/or the processor 425. The memory 427 may also be utilized to store information, such as configuration information, that may be utilized to control the operation of at least one block in the wireless device 420. For example, the memory 427 may comprise information necessary to configure the RF receiver 423a to enable receiving signals at various signal levels and in the presence of varying amounts of interference. In this regard, the baseband processor may store control and/or configuration information for one or more of the SSI 104, the LNA 110, the mixer 112, the filter 114 (and possibly 106 and 108), the regulator(s) 118, and/or the ADC 116.

Aspects of a method and system for variable resolution data conversion in a receiver are provided. In this regard, an analog received signal (103 of FIG. 1A) may be converted to a corresponding digital signal (117 of FIG. 1A), wherein a resolution of the corresponding digital signal may be varied (e.g., by configuring one or more switching elements) for the conversion based on one or more determined characteristics of said received signal. In this regard, the analog signal may be filtered (filter 106 of FIG. 1A) and/or amplified (LNA 110 of FIG. 1A) prior to determining the signal characteristics. The resolution of the conversion may be determined based on characteristics of in-band and/or out-of-band (e.g., as defined by filter 108 of FIG. 1A) signals. The resolution may be increased when received signal strength is below a threshold and may be decreased when received signal strength is above a threshold. Similarly, the resolution may be increased when interference is above a threshold and may be decreased when interference is below a threshold. The resolution may be increased when error rates are above a threshold and decreased when error rates are below a threshold.

Another embodiment of the invention may provide a machine-readable storage, having stored thereon, a computer program having at least one code section executable by a machine, thereby causing the machine to perform the steps as described herein for variable resolution data conversion in a receiver.

Accordingly, the present invention may be realized in hardware, software, or a combination of hardware and software. The present invention may be realized in a centralized fashion in at least one computer system or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A receiver comprising:
   a circuit comprising an analog-to-digital converter, said circuit being operable to measure a signal strength of an in-band RF signal;
   adjust a resolution of said analog-to-digital converter based on said signal strength of said in-band RF signal;
   down convert the in-band RF signal to a down converted signal; and
   digitally convert the down converted signal to a baseband digital representation via said analog-to-digital converter.

2. The receiver of claim 1, wherein said circuit is operable to adjust said resolution lower when said signal strength of said in-band signal RF is higher.

3. The receiver of claim 1, wherein said circuit is operable to adjust said resolution higher when said signal strength of said in-band RF signal is lower.

4. The receiver of claim 1, wherein said circuit is operable to amplify said RF in-band signal prior to measuring said signal strength of said in-band RF signal.

5. The receiver of claim 1, wherein said circuit is operable to:
   determine a signal-to-noise ratio of said in-band RF signal based on said signal strength of said in-band RF signal; and
   adjust said resolution of said analog-to-digital converter based on said signal-to-noise ratio.

6. The receiver of claim 1, wherein said circuit is operable to:
   determine a dynamic range of said in-band RF signal based on said signal strength of said in-band RF signal; and
   adjust said resolution of said analog-to-digital converter based on said dynamic range.

7. A method comprising:
   measuring a signal strength of an in-band RF signal;
   adjusting a resolution of an analog-to-digital converter based on said signal strength of the in-band RF signal;
   down converting the in-band RF signal to a down converted signal; and
   digitally converting the in-band RF signal to a digital representation via said analog-to-digital converter.

8. The method of claim 7 further comprising adjusting said resolution lower when said signal strength of said in-band RF signal is higher.

9. The method of claim 7 further comprising adjusting said resolution higher when said signal strength of said in-band RF signal is lower.

10. The method of claim 7 further comprising amplifying said in-band RF signal prior to said measuring.

11. The method of claim 7 further comprising:
    determining a signal-to-noise ratio of said in-band RF signal based on said signal strength of said in-band RF signal; and
    adjusting said resolution of said analog-to-digital converter based on said signal to-noise ratio.

12. The method of claim 7 further comprising:
    determining a dynamic range of said in-band RF signal based on said signal strength of said in-band RF signal; and
    adjusting said resolution of said analog-to-digital converter based on said dynamic range.

13. A receiver comprising:
    a circuit comprising an analog-to-digital converter, said circuit being operable to:
    measure a signal strength of an in-band RF signal;
    determine a signal-to-noise ratio of said in-band RF signal;
    adjust a resolution of said analog-to-digital converter;
    down convert the in-band RF signal to a down converted signal; and
    digitally convert said in-band RF signal to a digital representation via said analog-to-digital converter.

14. The receiver of claim 13, wherein said circuit is operable to adjust said resolution lower when said signal strength of said in-band RF signal is higher.

15. The receiver of claim 13, wherein said circuit is operable to adjust said resolution higher when said signal strength of said in-band RF signal is lower.

16. The receiver of claim 13, wherein said circuit is operable to amplify said in-band RF signal prior to measuring said signal strength of said in-band RF signal.

17. The receiver of claim 13, wherein said circuit is operable to adjust said resolution of said analog-to-digital converter based on said signal-to-noise ratio.

18. The receiver of claim 13, wherein said circuit is operable to:
    determine a dynamic range of said in-band RF signal based on said signal strength of said in-band RF signal; and
    adjust said resolution of said analog-to-digital converter based on said dynamic range.

19. A receiver comprising:
    a circuit comprising an analog-to-digital converter, said circuit being operable to:
    measure a signal strength of a selected in-band signal;
    adjust a resolution of said analog-to-digital converter based on said signal strength of said in-band signal;
    convert said selected in-band signal digitally convert the down converted signal to a digital representation via said analog-to-digital converter;
    determine a signal-to-noise ratio of said selected in-band signal based on said signal strength of said in-band signal; and
    adjust said resolution of said analog-to-digital converter based on said signal-to-noise ratio.

20. A method comprising:
    measuring a signal strength of a selected in-band signal;
    adjusting a resolution of an analog-to-digital converter based on said signal strength;
    converting said selected in-band signal to a digital representation via said analog-to-digital converter;
    determining a signal-to-noise ratio of said selected in-band signal based on said signal strength of said in-band signal; and
    adjusting said resolution of said analog-to-digital converter based on said signal to-noise ratio.

21. A receiver comprising:
    a circuit comprising an analog-to-digital converter, said circuit being operable to:
    measure a signal strength of a selected in-band signal;
    determine a signal-to-noise ratio of said selected in-band signal;

adjust a resolution of said analog-to-digital converter;
convert said selected in-band signal to a digital representation via said analog-to-digital converter,
wherein said circuit is operable to adjust said resolution of said analog-to-digital converter based on said signal-to-noise ratio.

* * * * *